United States Patent [19]

Todd et al.

[11] Patent Number: 5,719,423
[45] Date of Patent: Feb. 17, 1998

[54] ISOLATED POWER TRANSISTOR

[75] Inventors: James R. Todd; David Cotton, both of Plano; Roy Clifton Jones, III, Dallas, all of Tex.

[73] Assignee: Texas Instruments Incorporated, Dallas, Tex.

[21] Appl. No.: 697,661

[22] Filed: Aug. 28, 1996

Related U.S. Application Data

[60] Provisional application No. 60/003,088, Aug. 31, 1995.

[51] Int. Cl.$^6$ .................... H01L 29/76; H01L 29/94; H01L 31/062; H01L 31/113
[52] U.S. Cl. ............... 257/336; 257/337; 257/343; 257/344; 257/398; 437/59
[58] Field of Search ............... 257/335, 336, 257/337, 343, 344, 345, 394, 395, 396, 398, 400; 437/59, 56

[56] References Cited

U.S. PATENT DOCUMENTS

| | | |
|---|---|---|
| 5,406,110 | 4/1995 | Kwon et al. ............ 257/493 |
| 5,502,323 | 3/1996 | Kitamura et al. ........ 257/335 |
| 5,585,660 | 12/1996 | Mei ..................... 257/387 |
| 5,633,525 | 5/1997 | Kitamura et al. ........ 257/381 |

*Primary Examiner*—Ngân V. Ngô
*Attorney, Agent, or Firm*—W. James Brady, III; Richard L. Donaldson

[57] ABSTRACT

A high current power transistor is provided that comprises a drain region that includes a highly-doped drain region (54) and a lightly-doped drain region (50). The channel region (52) is activated by a gate conductor (32). The channel region separates the lightly-doped drain region (50) from a D-well region (40). A sidewall insulator body (44) is used to form the lightly-doped drain region (50) and the lightly-doped drain region (54). The transistor is formed in an active region (20) which comprises a portion of an n-type epitaxial layer (12) formed outwardly from a p-type substrate (10). The isolation structures (14) and (16) as well as the epitaxial layer (12) provides for a transistor that can be used in both source follower and common source configurations.

12 Claims, 3 Drawing Sheets

ISOLATED POWER TRANSISTOR

This application claims priority under 35 U.S.C. §119 of provisional application Ser. No. 60/003,088, filed Aug. 31, 1995, now abandoned.

TECHNICAL FIELD OF THE INVENTION

This invention relates in general to the field of electronic devices and more particularly to an isolated power transistor and method of forming the same.

BACKGROUND OF THE INVENTION

Solid state devices that are used to provide power for motors and RF devices are often implemented using field effect transistors. These field effect devices may be used in both source follower and common source configurations to provide drive current for the devices. The power transistors comprise relatively large gate conductors which are interdigitated between source and drain regions. The transistor architectures must provide for high current capability while maintaining large voltage drops between the gate, source and drains of the devices.

Prior systems have provided for adequate current carrying capability at adequate voltage ranges but have done so without isolating the devices from each other or the substrate. As such, these prior systems can only be used in common source configurations because the back gate of the devices is necessarily tied to the substrate voltage or the drain is tied to the substrate voltage.

SUMMARY OF THE INVENTION

Accordingly, a need has arisen for a field effect device which provides for high current-carrying capability with relatively high breakdown voltages but which allow isolation of the device from the substrate voltage to allow the device to be used in source follower or common source configurations within an integrated power system.

In accordance with the teachings of the present invention, a power transistor is provided that comprises a substrate having a first conductivity type with an epitaxial layer formed in contact with the substrate, the epitaxial tank comprising a second conductivity type. An isolation region is formed surrounding an active region within the epitaxial layer. The transistor further comprises a highly-doped drain region and a lightly-doped drain region. The device also comprises a conductive gate and a source region, the conductive gate controlling a channel region formed between the source region and the lightly-doped drain region. A D-well region is formed in contact with the source regions and comprises impurities of the first conductivity type.

BRIEF DESCRIPTION OF THE DRAWINGS

A more complete understanding of the present invention may be acquired by referring to the accompanying Figures in which like reference numbers indicate like features and wherein.

DETAILED DESCRIPTION OF THE INVENTION

Figure 1A:
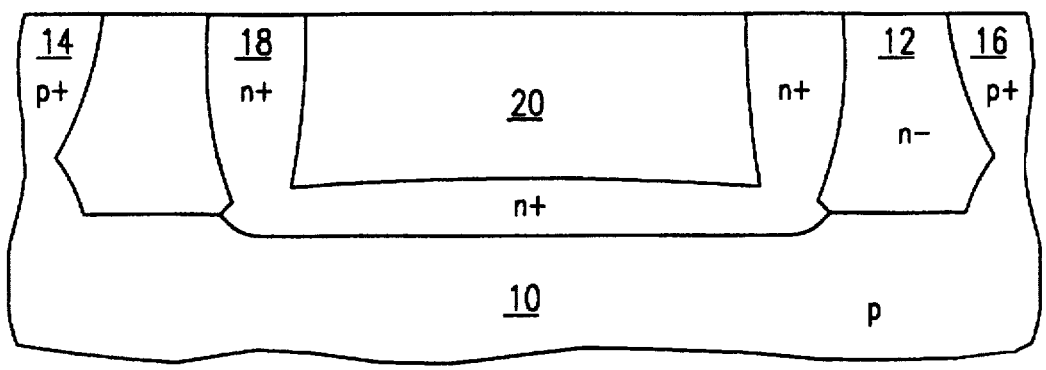
FIGS. 1a–1g are a series of schematic cross-sectional diagrams illustrating the construction of one embodiment of a power transistor according to the teachings of the present invention.

FIGS. 1a–1g illustrate the sequential processing steps which may be used to construct a power field effect transistor according to the teachings of the present invention. Referring to FIG. 1a, a p-type substrate 10 is provided that comprises a resistivity on the order of 12–16 ohm centimeters. The outer surface of the substrate 10 is provided with diffused regions prior to the growth of an n– epitaxial layer 12. The diffused regions and the outer surface of the substrate 10 are then augmented by diffusions to the outer surface of epitaxial layer 12 to provide for p+ isolation regions 14 and 16 and n+ isolation ring 18. Isolation regions 14, 16 and 18 isolate and define an active region 20 in which the power transistor of the present invention is formed. The power transistor formed in active region 20 is isolated from other devices formed on substrate 10 in epitaxial layer 12 by the isolation effects of isolation regions 14 and 16 and the junction between epitaxial layer 12 and substrate 10. Isolation ring 18 prevents the injection of holes into substrate 10 during particular loading and transient conditions for the power transistor.

Because of the presence of isolation regions 14 and 16 and the junction of epitaxial layer 12 with substrate 10, the power transistor formed in active region 20 can be used in either a source follower or common source configuration of a power circuit. This is in contrast to other devices which are not formed in isolated regions of an epitaxial layer and are thus automatically coupled to the voltage of the substrate in which they are formed. These devices may only be used in common source configurations.

Figure 1B:
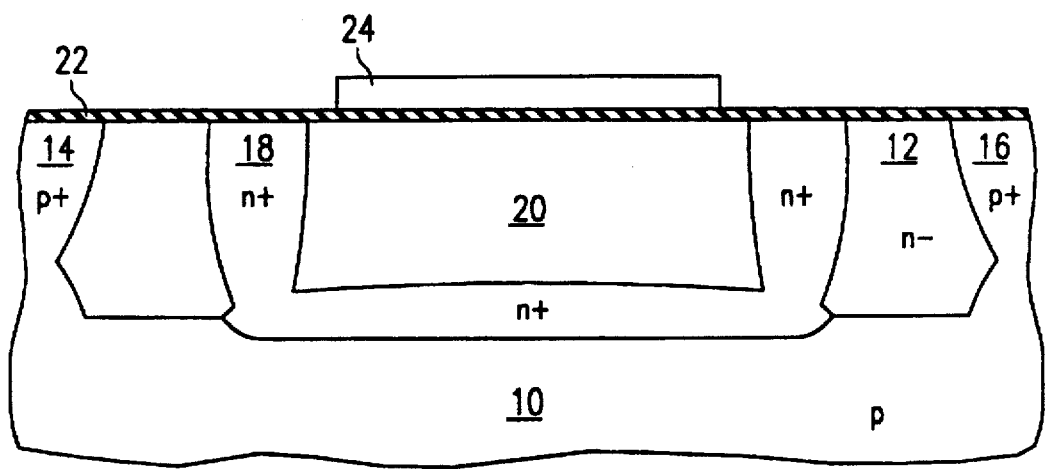
Figure 1C:
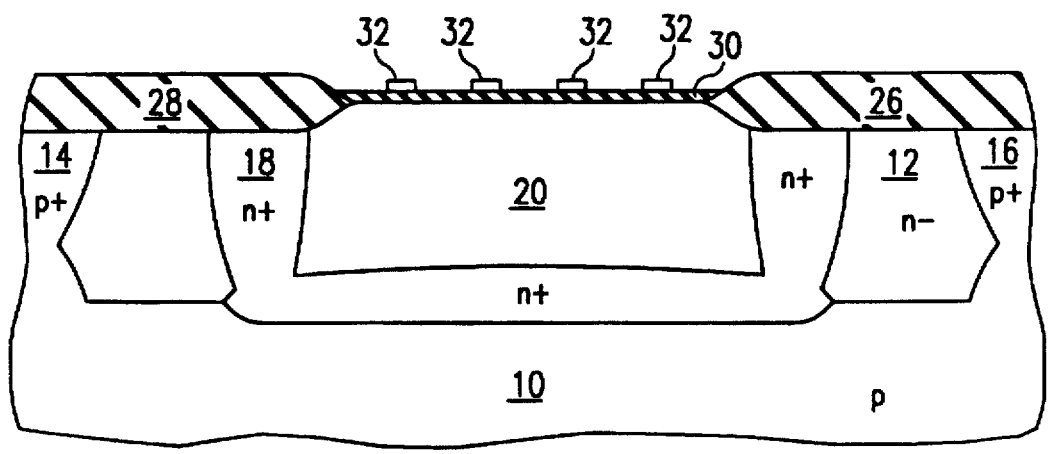

Referring to FIG. 1b, a 500-angstrom layer 22 of silicon dioxide is grown on the outer surface of epitaxial layer 12. A silicon nitride mask body 24 is then formed by depositing on the order of 1400 angstroms of silicon nitride and photolithographically patterning and etching the silicon nitride layer to form mask body 24 covering most of the outer surface of active region 20. The structure shown in FIG. 1b is then subjected to an oxidation process which forms field oxide bodies 26 and 28 shown in FIG. 1c. The silicon nitride mask body 24 is then removed as well as the remainder of layer 22. A series of conventional processing steps are then used to grow a 500-angstrom thick gate oxide layer 30 shown in FIG. 1c. A layer of polycrystalline silicon is then deposited covering the entire structure. This layer is patterned and etched using conventional photolithographic processes to form an intricate gate conductor which comprises a number of gate conductor fingers 32 shown in FIG. 1c. The gate conductor fingers 32 are insulated from the outer surface of active region 20 by the gate oxide 30. The spaces between the gate conductor fingers 32 are alternating instances of source regions and drain regions, the structure of each of which will be fully described herein.

Figure 1D:
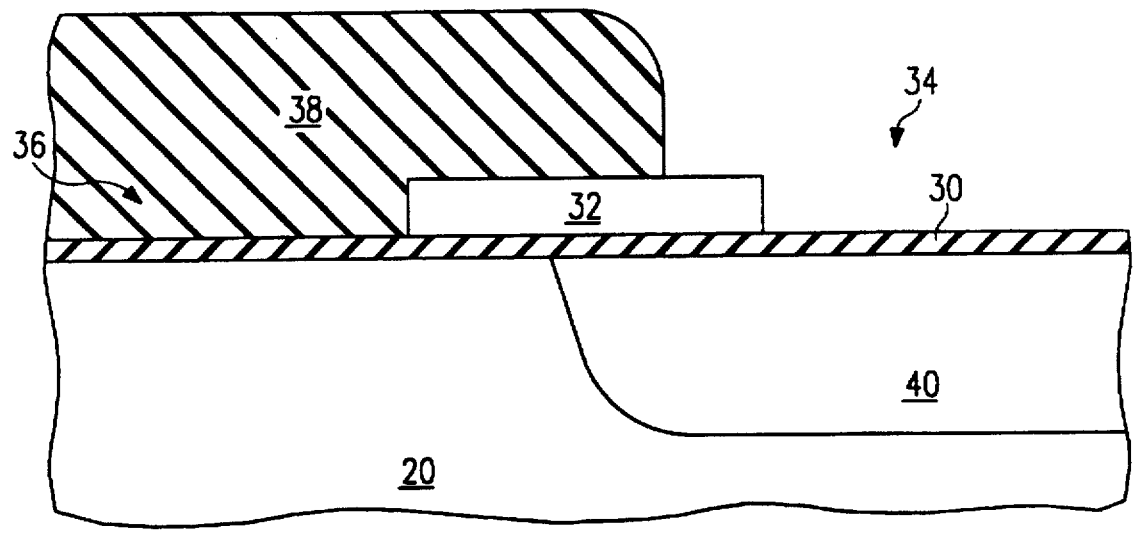

FIG. 1d shows an expanded view of a single gate conductor 32. Gate conductor 32 has a source region indicated generally at 34 on the right side of gate conductor 32. Similarly, a drain region indicated generally at 36 is on the left side of gate conductor 32. The processing of the transistor of the present invention continues by covering the drain region 36 with a photoresist mask 38 shown in FIG. 1d. A D-well implant step is then used to form a D-well region 40 within source region 34. The D-well implant step comprises the implantation of boron ions at a dose of 4E13 ions per square centimeter and at an energy of 40 keV. The implanted structure is then subjected to a D-well diffusion step which comprises heating the structure at 1100° C. for on the order of 12 hours. These steps result in the profile of D-well region 40 shown in FIG. 1d. Photoresist mask 38 is then removed.

Figure 1E:
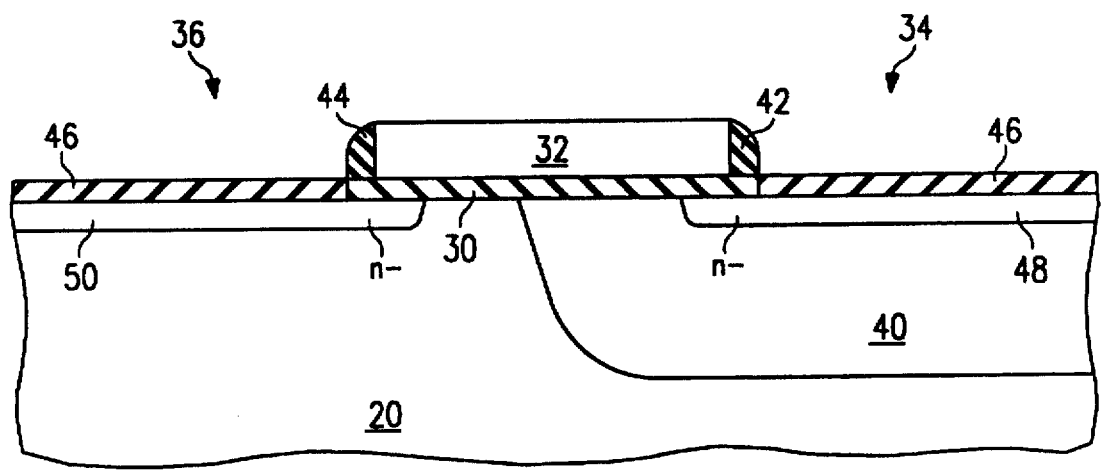

Referring to FIG. 1e, processing continues with the formation of sidewall insulator bodies 42 and 44. Sidewall insulator bodies 42 and 44 are formed by first depositing 3,000 angstroms of oxide using a TEOS deposition process. The 3,000 angstrom oxide is then etched anisotropically to leave sidewall insulator bodies 42 and 44. This etching process also removes the portions of gate oxide layer 30 which are not covered by gate conductor 32 or sidewall insulator bodies 42 or 44. A second TEOS deposition of 300 angstroms of oxide is then performed to form insulator layer 46 covering the 20 device including the source region 34, drain region 36, and gate region 32.

Processing then continues with the formation of n– source region 48 and n– drain region 50. Regions 48 and 50 are formed by first forming a photoresist mask which is not shown to keep the n-type impurities to be implanted out of contact regions to D-well 40. The n– regions 48 and 50 are then formed using a phosphorous implant which is self-aligned to the exposed edges of insulator bodies 42 and 44. The phosphor implant is performed at dosage of 4e14 ions per square centimeter at an energy on the order 80 keV. The regions are than annealed for forty-five minutes at approximately 900° C.

Figure 1F:
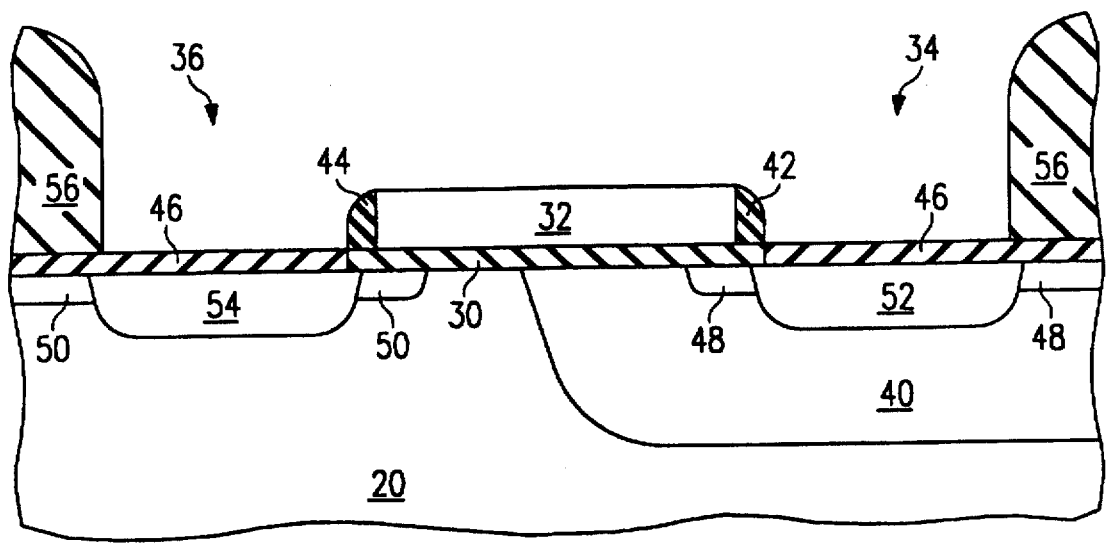

Referring to FIG. 1f, processing continues with the formation of n+ source region 52 and n+ drain region 54. Regions 52 and 54 are formed by first forming a photoresist mask 56. An implantation of arsenic ions is then performed at a dosage of 3E15 and an energy on the order of 135 keV. The arsenic implant is then annealed for forty-five minutes at approximately 900° C. The arsenic implant is, once again, self-aligned to the exposed edges of insulator bodies 42 and 44.

Figure 1G:
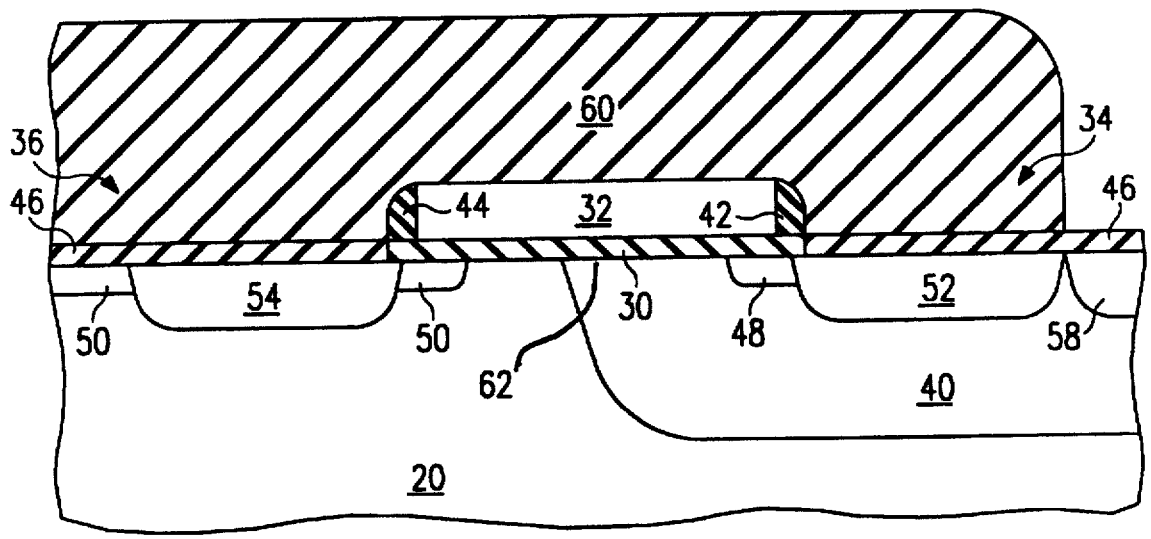

Referring to FIG. 1g, the process of the present invention concludes with the formation of a back gate contact region 58. Region 58 is formed by first forming a photoresist mask 60 and then performing two boron implants. The first boron implant is at a dosage of 2E15 at 40 keV. The second boron implant is also at a dosage of 2E15 but at an energy of 120 keV. After annealing, these implants provide a contact to D-well region 40. Conventional methods may then be used to form circuit contacts to D-well contact region 58, source region 52, drain region 54 and gate conductor 32.

The voltage on gate conductor 32 controls the conductance of a channel region indicated generally at 62. Due to the incorporation of drain region 50 and source region 48 which both comprise lightly-doped n-type regions, the device shown in FIG. 1g enjoys a very low source-to-drain resistance when the channel region 62 is activated. In addition, because the highly-doped drain region 54 is spaced apart from the gate conductor 32 because of the use of sidewall insulator 44, the device is able to withstand a large source-to-drain voltage and drain-to-gate voltage difference without experiencing breakdown.

As discussed previously, the device is constructed within an active region 20 which comprises an n-type epitaxial tank constructed within a p-type substrate. For this reason, the back gate 40 is not coupled automatically to the substrate voltage. As such, the device shown in FIG. 1g can be used in an isolated context in either a common source or a source follower driver configuration.

According to an alternate embodiment of the present invention, an additional masking step could be used to prevent the formation of sidewall insulator body 42. The source-to-drain resistance could be further reduced by allowing the highly-doped source region 52 to be formed in an implantation step which was self-aligned to the right edge of gate conductor 32 as opposed to the outer edge of sidewall insulator body 42. This alternative embodiment includes an extra masking step to prevent the formation of sidewall insulator body 42.

A variety of alternative methods may be used to form the isolation regions 14 and 16 described previously. The method described with reference to FIG. 1a was the combination of a surface implant of p-type impurities and a buried implant formed prior to the formation of the epitaxial layer 12. In addition, trench isolation techniques may be used. For example, trenches can be formed through etching processes. The trenches may then be filled with oxide or other suitable insulator to provide isolation of the active region 20 from the remaining circuits.

Although the present invention has been described with reference to the formation of an n-type epitaxial tank formed on a p-type substrate, the invention is equally applicable to the reverse of these conductivity types. For example, the same structure could be formed in a p-type epitaxial tank formed on an n-type substrate. In this context, the regions described as formed with n-type implantations would be formed with the opposite conductivity type.

Although the present invention has been described in detail, it should be understood that various changes, modifications and alterations to the teachings described herein may be made without departing from the spirit and scope of the present invention, which is solely defined by the appended claims.

What is claimed is:

1. A high current field effect transistor comprising:

a semiconductor substrate having a first conductivity type;

an epitaxial tank of a semiconductor material having a second conductivity type formed outwardly from the semiconductor substrate;

an isolation region formed in the epitaxial tank to define an active region of semiconductor material having the second conductivity type;

a gate conductor insulatively disposed adjacent the outer surface of the active region;

a D-well diffused region comprising impurities of the first conductivity type formed in the active region inwardly from a portion of the gate conductor and from portions of the outer surface of the active region;

a source region formed proximate the outer surface of the active region adjacent the D-well region and proximate the gate conductor, the source region comprising impurities of the first conductivity type;

the gate conductor defining a channel region proximate the surface of the active region;

the channel region adjacent to the D-well region;

a lightly-doped drain region adjacent to the channel region and proximate the gate conductor, the lightly-doped drain region comprising a light dose of impurities of the second conductivity type, the lightly-doped drain region separated from the D-well region by the channel region; and a highly-doped drain region adjacent to the surface of the active region and to the lightly-doped drain region, the highly-doped drain region separated from the channel region by the lightly-doped drain region, the highly-doped drain region comprising a high dose of impurities of the second conductivity type.

2. The transistor of claim 1 wherein the first conductivity type comprises a p conductivity type and wherein the second conductivity type comprises an n conductivity type.

3. The transistor of claim 1 wherein the first conductivity type comprises an n conductivity type and wherein the second conductivity type comprises a p conductivity type.

4. The transistor of claim 1 and further comprising a sidewall insulator body proximate to a sidewall of the gate conductor body and proximate the lightly-doped drain region and the highly-doped drain region.

5. The transistor of claim 4 wherein the sidewall insulator body comprises oxide formed using TEOS.

6. The transistor of claim 1 wherein the isolation region comprises a trench formed in the outer surface of the epitaxial layer filled with insulator material.

7. The transistor of claim 1 wherein the isolation region comprises a region of implanted impurities of the first conductivity type.

8. The transistor of claim 4 and further comprising a second sidewall insulator body formed proximate a sidewall of the gate conductor proximate the source region.

9. The transistor of claim 8 and further comprising a lightly-doped source region proximate the source region and the second sidewall insulator body.

10. The transistor of claim 1 and further comprising an isolation ring surrounding the transistor and comprising highly-doped regions comprising impurities of the second conductivity type, the isolation ring operable to reduce the injection of charge carriers from the regions surrounding the transistor into the substrate of the first conductivity type.

11. A high current field effect transistor comprising:

a semiconductor substrate having a first conductivity type;

an epitaxial tank of a semiconductor material having a second conductivity type formed outwardly from the semiconductor substrate;

an isolation region formed in the epitaxial tank to define an active region of semiconductor material having the second conductivity type;

a gate conductor insulatively disposed adjacent the outer surface of the active region;

a D-well diffused region comprising impurities of the first conductivity type formed in the active region inwardly from a portion of the gate conductor and from portions of the outer surface of the active region;

a source region formed proximate the outer surface of the active region adjacent the D-well region and proximate the gate conductor, the source region comprising impurities of the first conductivity type;

the gate conductor defining a channel region proximate the surface of the active region;

the channel region adjacent to the D-well region;

a lightly-doped drain region adjacent to the channel region and proximate the gate conductor, the lightly-doped drain region comprising a light dose of impurities of the second conductivity type, the lightly-doped drain region separated from the D-well region by the channel region;

a highly-doped drain region adjacent to the surface of the active region and to the lightly-doped drain region, the highly-doped drain region separated from the channel region by the lightly-doped drain region, the highly-doped drain region comprising a high dose of impurities of the second conductivity type;

a sidewall insulator body approximate to a sidewall of the gate conductor body and proximate the lightly-doped drain region and the highly-doped drain region; and the isolation region comprises a region of implanted impurities of the first conductivity type.

12. A method of forming a high current field effect transistor comprising the steps of:

forming a semiconductor substrate having a first conductivity type;

forming an epitaxial tank of a semiconductor material having a second conductivity type outwardly from the semiconductor substrate;

forming an isolation region in the epitaxial tank to define an active region of semiconductor material having the second conductivity type;

forming a gate conductor insulatively disposed adjacent the outer surface of the active region;

forming a D-well diffused region comprising impurities of the first conductivity type in the active region inwardly from a portion of the gate conductor and from portions of the outer surface of the active region;

forming a source region proximate the outer surface of the active region adjacent the D-well region and proximate the gate conductor, the source region comprising impurities of the first conductivity type, the gate conductor defining a channel region proximate the surface of the active region, the channel region adjacent to the D-well region;

forming a lightly-doped drain region adjacent to the channel region and proximate the gate conductor, the lightly-doped drain region comprising a light dose of impurities of the second conductivity type, the lightly-doped drain region separated from the D-well region by the channel region;

forming a highly-doped drain region adjacent to the surface of the active region and to the lightly-doped drain region, the highly-doped drain region separated from the channel region by the lightly-doped drain region, the highly-doped drain region comprising a high dose of impurities of the second conductivity type; and forming a sidewall insulator body proximate to a sidewall of the gate conductor body and proximate the lightly-doped drain region and the highly-doped drain region.

* * * * *